United States Patent
Huang

(10) Patent No.: US 7,189,646 B2
(45) Date of Patent: Mar. 13, 2007

(54) METHOD OF ENHANCING THE ADHESION BETWEEN PHOTORESIST LAYER AND SUBSTRATE AND BUMPING PROCESS

(75) Inventor: Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 253 days.

(21) Appl. No.: 10/710,786

(22) Filed: Aug. 3, 2004

(65) Prior Publication Data

US 2005/0042854 A1 Feb. 24, 2005

(30) Foreign Application Priority Data

Aug. 21, 2003 (TW) .............................. 92122955 A

(51) Int. Cl.
*H01L 21/027* (2006.01)
(52) U.S. Cl. .............................. 438/671; 257/E21.023
(58) Field of Classification Search ................ 438/671, 438/675; 257/E21.023, E21.035
See application file for complete search history.

(56) References Cited

U.S. PATENT DOCUMENTS 6,335,216 B1 * 1/2002 Yoshida et al. ............... 438/40
6,372,622 B1 * 4/2002 Tan et al. .................... 438/612
6,602,775 B1 * 8/2003 Chen et al. .................. 438/612
6,649,507 B1 * 11/2003 Chen et al. .................. 438/614
6,784,089 B2 * 8/2004 Lei et al. ..................... 438/613
2003/0165770 A1 * 9/2003 Lee et al. .................... 430/191
2005/0277245 A1 * 12/2005 Ohta et al. ................... 438/222

FOREIGN PATENT DOCUMENTS

JP 10124826 A * 5/1998

* cited by examiner

*Primary Examiner*—Carl Whitehead, Jr.
*Assistant Examiner*—Jennifer M Dolan
(74) *Attorney, Agent, or Firm*—Jiang Chyun IP Office

(57) ABSTRACT

A method of enhancing the adhesion between photoresist material and a substrate that can be applied to fabricate bumps on the substrate is provided. The bump fabrication process uses at least photoresist materials each having a different viscosity. A photoresist material having a smaller viscosity, that is, a higher fluidity, is permitted to contact a passivation layer so that all the gaps on the surface of the passivation layer are completely filled and a strong bond is formed between the photoresist layer and the passivation layer. With all the gaps on the substrate completely filled, solder material is prevented from filling the gaps to form a conductive bridge between neighboring bonding pads in a subsequent bump fabrication process.

8 Claims, 6 Drawing Sheets

US 7,189,646 B2

METHOD OF ENHANCING THE ADHESION BETWEEN PHOTORESIST LAYER AND SUBSTRATE AND BUMPING PROCESS

CROSS REFERENCE TO RELATED APPLICATIONS

This application claims the priority benefit of Taiwan application serial no. 92122955, filed Aug. 21, 2003.

BACKGROUND OF INVENTION

1. Field of the Invention

The present invention relates to a method of enhancing the adhesion between photoresist layer and a substrate and a bumping process. More particularly, the present invention relates to a method of enhancing the adhesion between photoresist layer and a substrate and a bumping process that utilizes at least two photoresist layers having different viscosity.

2. Description of the Related Art

In this information technology society, the use of multimedia systems is expanding at an ever increasing rate. As a result, integrated circuit manufacturers have produced countless new digital electronic devices capable of networking and catering for a variety of personal tastes. To meet the demands of most customers, the electronic device must have a high processing speed, many powerful functions, highly integrated circuits, a miniaturized body having very little weight and a low selling price. Following this trend, the circuit density inside many integrated circuit packages are increased to produce high package density packages such as the ball grid array (BGA) packages, the chip scale packages (CSP), the flip-chip (F/C) packages and the multi-chip modules (MCM). The quality of a package is often assessed according to its integrated circuit package density, which is the number of pins per unit area. For a high-density integrated circuit package, a shorter average wiring length is often translated into a higher signaling speed. Since bump connection is able to shorten transmission length considerably, its application is widespread in high-density packages.

FIGS. 1A through 1F are schematic cross-sectional views showing the steps in a conventional bumping process. As shown in FIG. 1A, a wafer 100 having a plurality of bonding pads 102 thereon is provided. A passivation layer 106 is formed over an active surface of the wafer 100. The passivation layer 106 exposes the bonding pads 102. The wafer further has an under-bump metallurgy (UBM) layer 104 disposed over the exposed active surface and a portion of the passivation layer 106 around the bonding pad 102.

As shown in FIG. 1B, a photoresist layer 108 is formed over the wafer 100. Thereafter, as shown in FIG. 1C, a photolithography and development process is performed to form a plurality of openings 108a in the photoresist layer 108 above the bonding pads 102. Through the openings 108a, a portion of the under-bump metallurgy (UBM) layer 104 is exposed.

As shown in FIG. 1D, a solder material is deposited to fill the openings 108a by stencil printing process so that a plurality of solder posts 110 is formed over the UBM layer 104. As shown in FIG. 1E, the photoresist layer 108 is removed to expose the solder posts 110.

As shown in FIG. 1F, a reflow process is then performed to heat the solder posts 110 into a partially melted state so that a spherical-like solder posts 110 is formed due to the cohesion thereof. Then, the spherical-like solder posts 110 are cooled and form a plurality of spherical bumps 110a.

In the aforementioned bumping process, the top surface of the passivation layer is typically rough so that the photoresist layer can not adhere entirely on the top surface of the passivation layer. Thus, gaps are often formed between the photoresist layer and the passivation layer. However, with the ever-increasing density in the integrated circuit package, the pitch between neighboring bonding pads is getting smaller and smaller. When the solder material are filled into the openings to form the solder posts, some of the gaps may also be filled by the solder material so that two neighboring bonding pads will electrically bridge through the solder material.

FIG. 1G is a schematic cross-sectional view showing a portion of the region between neighboring bumps fabricated according to a conventional bumping process. As shown in FIG. 1G, the aforementioned steps of performing a photolithography and development process to form openings in the photoresist layer 108 and filling the openings by a stencil printing process to form solder posts 110 are similarly applied. However, due to the gaps 112 formed between the passivation layer 106 and the photoresist layer 108, some of the solder material may be filled into the gaps 112 so that the bonding pads 102 on each side of the gaps 112 will electrically bridge through the solder material.

SUMMARY OF INVENTION

Accordingly, the present invention is to provide a bumping process capable of preventing the electrical bridging phenomenon occurring between two neighboring bonding pads.

As embodied and broadly described herein, the invention provides a bumping process comprising the following steps. First, a wafer having a plurality of bonding pads and a passivation layer that exposes the bonding pads is provided. A metallic layer is formed over the wafer to cover at least the bonding pads. Thereafter, a first photoresist layer is formed over the wafer and then a second photoresist layer is formed over the first photoresist layer. The first photoresist layer has a viscosity smaller than the second photoresist layer. After that, a photolithography process is performed to form a plurality of openings in the first photoresist layer and the second photoresist layer. The openings expose the metallic layer above the bonding pads. A solder material is filled into the openings to form a plurality of solder posts. Finally, the first photoresist layer and the second photoresist layer are removed.

In the bumping process of the present embodiment, the solder material is filled into the openings by electroplating or stencil printing. Furthermore, after removing the first photoresist layer and the second photoresist layer, a reflow process is performed to form a plurality of bumps over the metallic layer. In addition, the first photoresist layer and the second photoresist layer are dry films, for example.

The bumping process of the present invention utilizes two types of photoresist layer having different viscosity. The photoresist layer adhered with the passivation layer has a smaller viscosity or higher fluidity so that the photoresist layer is able to adhere tightly with the passivation layer. Hence, there is no gaps and electrical bridging phenomenon between the photoresist layer and the passivation layer, thereby providing an effective isolation between two neighboring bonding pads.

The present invention also provides a method for enhancing the adhesion between a photoresist layer and a substrate. First, a first photoresist layer having a lower viscosity is formed over the substrate. Thereafter, a second photoresist layer having a higher viscosity is formed over the first photoresist layer. The first photoresist layer and the second photoresist layer are dry films, for example.

The method of enhancing the adhesion between a photoresist layer and a substrate can be applied to join together various types of photoresist layers and substrates beside the aforementioned bumping process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
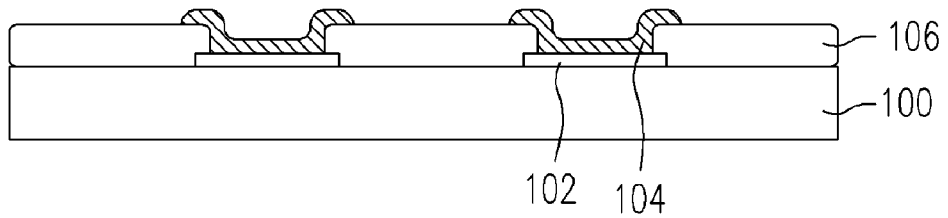
FIGS. 1A through 1F are schematic cross-sectional views showing the steps in a conventional bumping process.
Figure 1B:
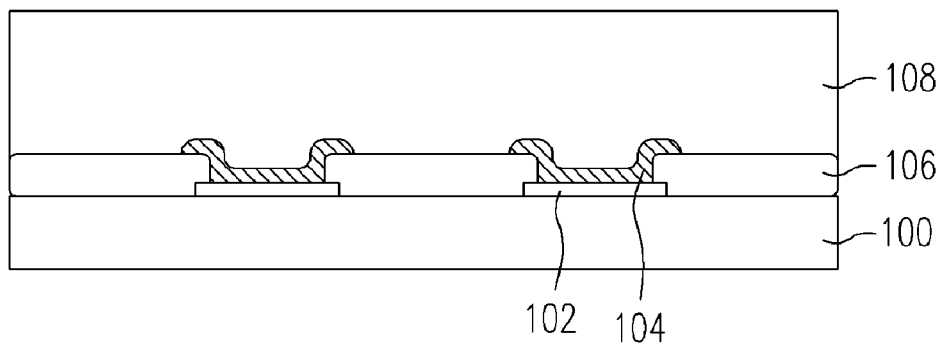
Figure 1C:
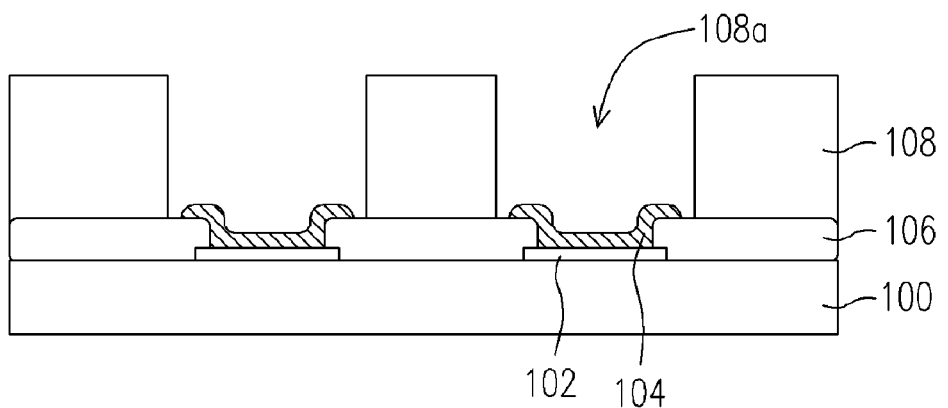
Figure 1D:
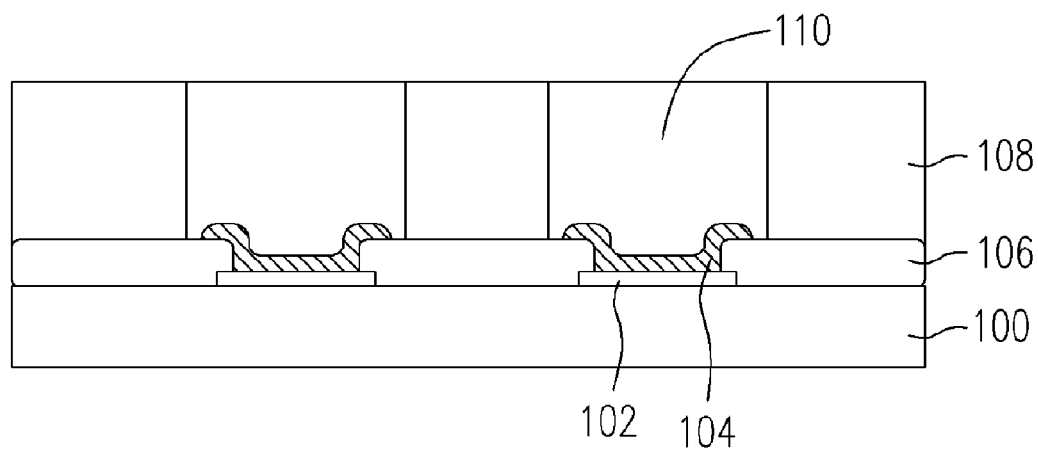
Figure 1E:
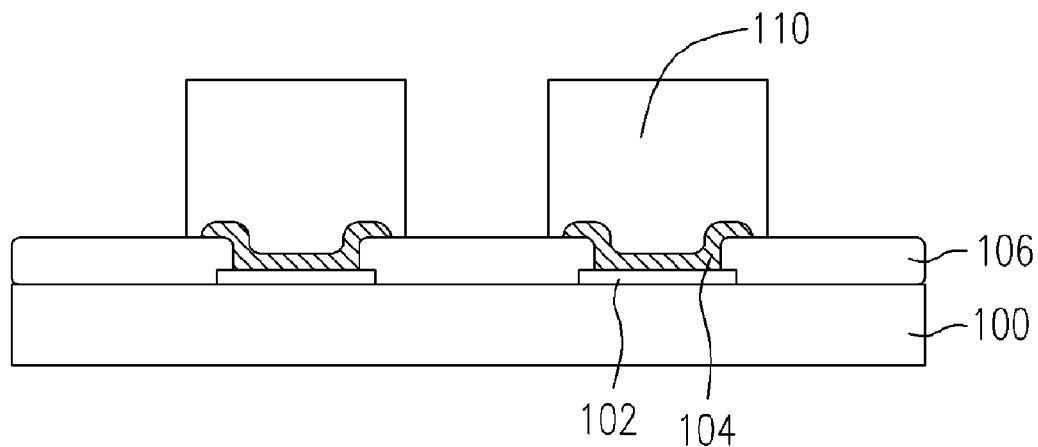
Figure 1F:
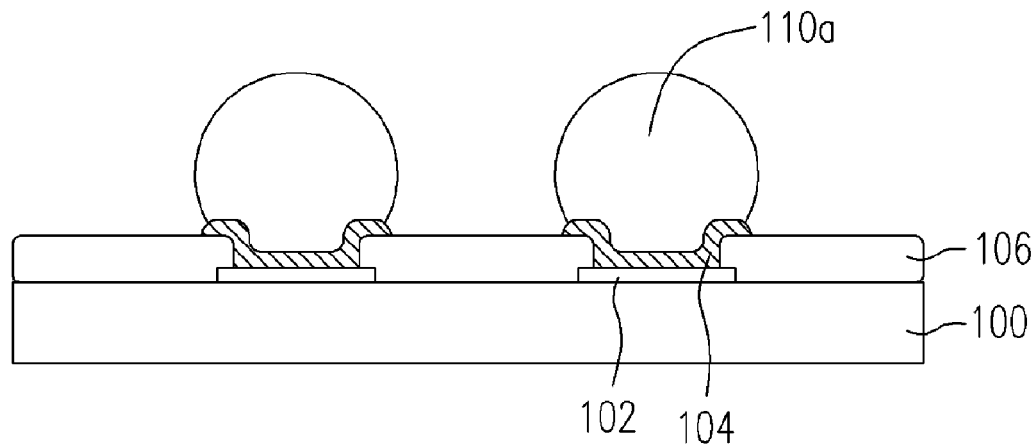
Figure 1G:
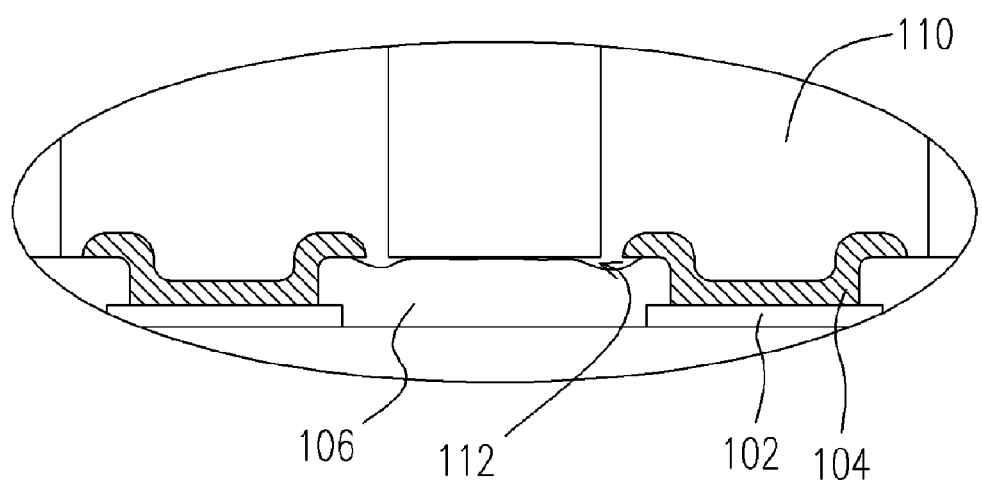
FIG. 1G is a schematic cross-sectional view showing a portion of the region between neighboring bumps fabricated according to a conventional bumping process.

Reference will now be made in detail to the present embodiments of the invention, examples of which are illustrated in the accompanying drawings. Wherever possible, the same reference numbers are used in the drawings and the description to refer to the same or like parts.

Figure 2A:
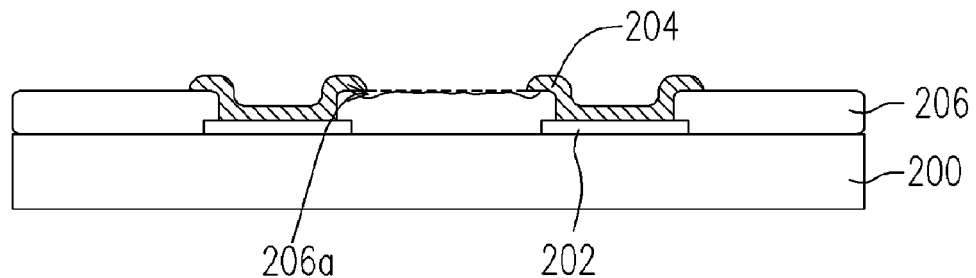
FIGS. 2A through 2G are schematic cross-sectional views showing the steps in a bumping process according to one embodiment of the present invention.

FIGS. 2A through 2G are schematic cross-sectional views showing the steps in a bumping process according to one embodiment of the present invention. As shown in FIG. 2A, a wafer 200 having a plurality of bonding pads 202 and a passivation layer 206 that exposes the bonding pads 202 is provided. A patterned under-bump metallurgy (UBM) layer 204 is further disposed over each bonding pad 202. It should be noted that the top surface of the passivation layer 206 is not always a smooth flat surface so that a photoresist layer formed over the passivation layer 206 may not tightly adhere with each other resulting in the formation of gaps 206a. In a subsequent printing process, some of the solder material may be filled into these gaps 206a to form an unwanted solder bridge that electrically connects two neighboring bonding pads 202 on each side of the gaps 206a. In the prevent invention, two types of photoresist layer having different viscosity are used to mitigate this problem.

Figure 2B:
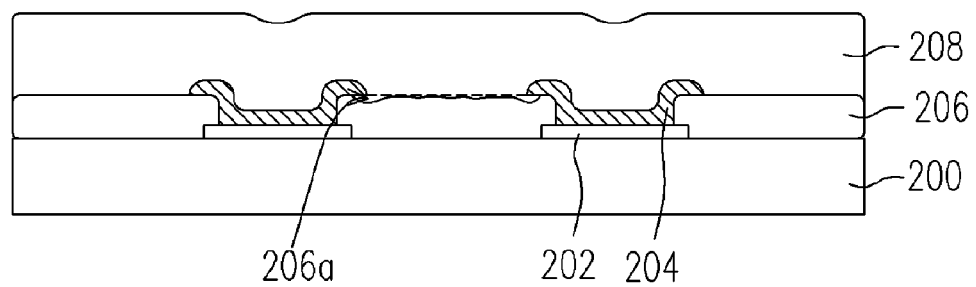
Figure 2C:
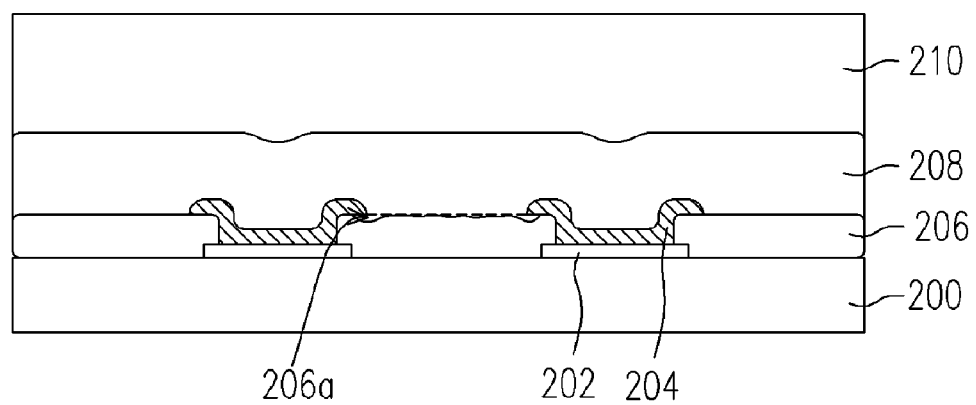

As shown in FIGS. 2B and 2C, dry films or other types of photoresist layers are sequentially applied over the wafer 200 to form a first photoresist layer 208 and a second photoresist layer 210 that cover the bonding pads 202, the UBM layer 204 and the passivation layer 206. It should be noted that the first photoresist layer 208 must have a viscosity lower than the second photoresist layer 210. With a smaller viscosity, the photoresist material can fill into tiny gaps 206a easily so that the first photoresist layer 208 and the passivation layer 206 are tightly adhered to each other.

Figure 2D:
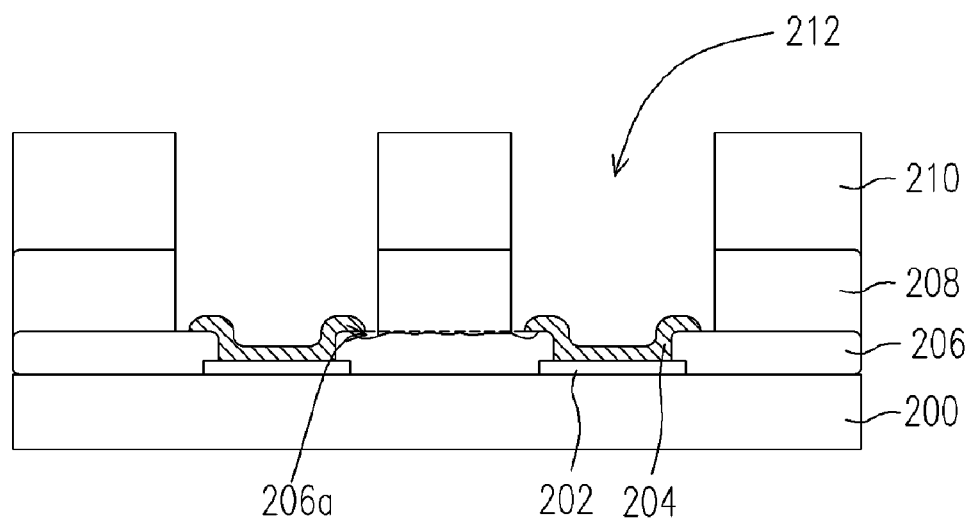

As shown in FIG. 2D, an exposure and development process is performed on the first photoresist layer 208 and the second photoresist layer 210 to form a plurality of openings 212 that exposes the UBM layer 204 above the bonding pads 202.

Figure 2E:
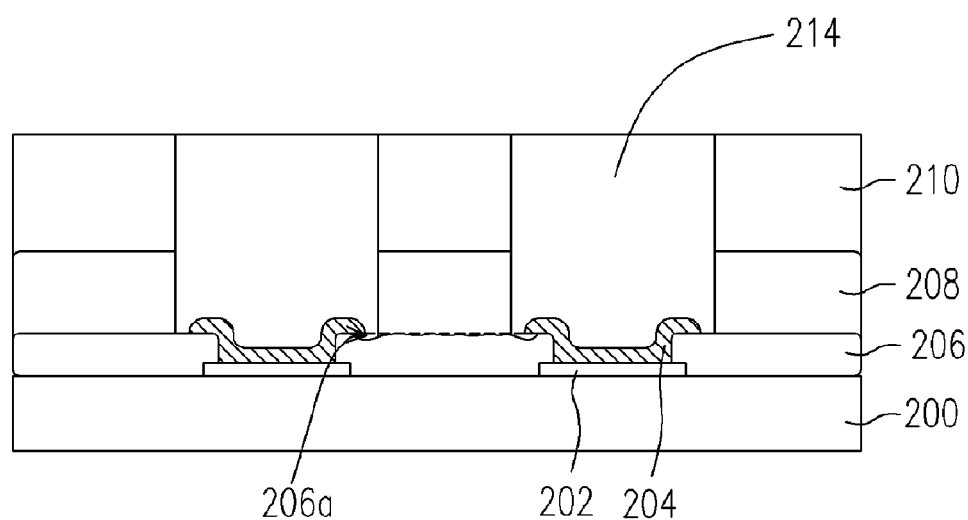
Figure 2F:
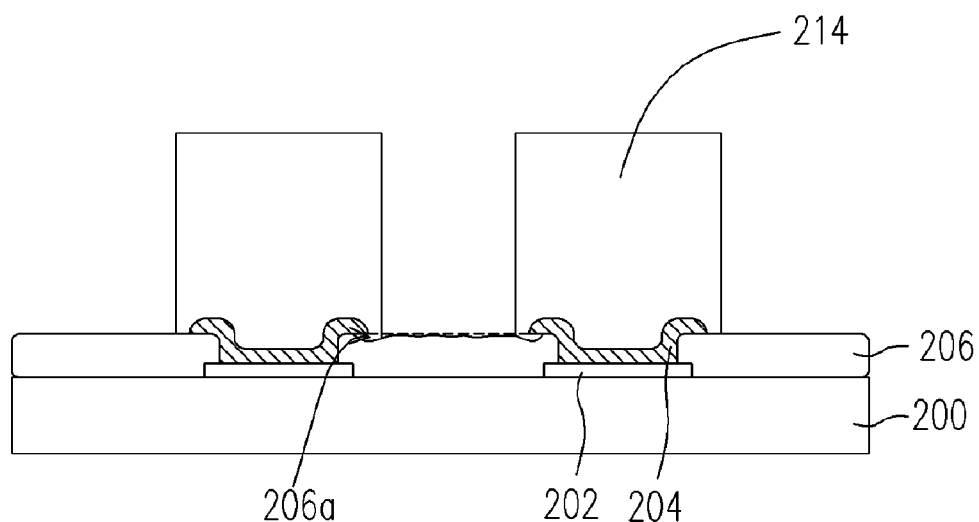

As shown in FIGS. 2E and 2F, a solder material is filled into the openings 204 and form a plurality of solder posts 214 by a stencil printing process, for example. Thereafter, the first photoresist layer 208 and the second photoresist layer 210 are removed.

Figure 2G:
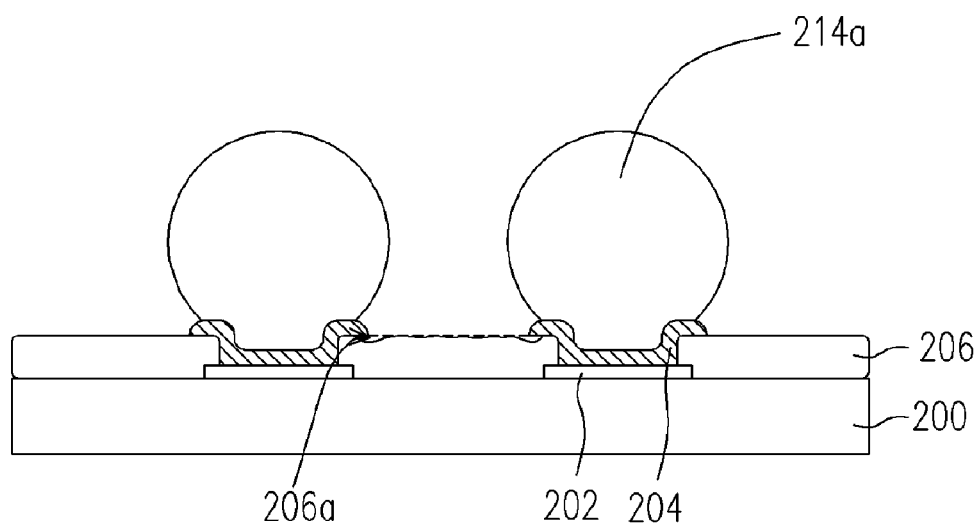

As shown in FIG. 2G, a reflow process is performed to melt the solder posts 214 and transform the solder posts 214 into spherical shape through cohesion. After the solder material is cooled, a plurality of bumps 214a is formed over the under-bump metallurgy (UBM) layer.

In summary, the bumping process of the present invention utilizes two photoresist layer having different viscosity to enhance the adhesion between the photoresist layer and the passivation layer. With a lower viscosity, the photoresist material can fill the gaps on the surface of the passivation more readily. With all gaps filled, the solder material can no longer be filled into the gaps to form a solder bridge between neighboring bonding pads and result in an abnormal connection.

Although a bumping process is provided in the aforementioned embodiment to illustrate a method for enhancing the adhesion between a photoresist layer and a substrate, the method can be applied to various types of substrates. Furthermore, a variety of photoresist materials can be used and combined to fit a diversity of application environments.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A bumping process, comprising:
providing a wafer having a plurality of bonding pads and a passivation layer that exposes the bonding pads;
forming a metallic layer over the bonding pad wherein a portion of the passivation layer is exposed by the metallic layer;
forming a first photoresist layer over the wafer;
forming a second photoresist layer over the first photoresist layer; wherein the first photoresist layer has a viscosity smaller than the second photoresist layer;
performing an exposure and development process to form a plurality of openings in the first and the second photoresist layer, wherein the openings expose the metallic layer;
filling a solder material into the openings to form a plurality of solder posts; and removing the first photoresist layer and the second photoresist layer.

2. The bumping process of claim 1, further comprising performing a reflow process to transform the solder posts into a plurality of bumps over the metallic layer after removing the first and the second photoresist layer.

3. The bumping process of claim 1, wherein the first photoresist layer comprises a dry film.

4. The bumping process of claim 1, wherein the second photoresist layer comprises a dry film.

5. The bumping process of claim 1, wherein the step of filling the solder material into the openings comprises electroplating or stencil printing.

6. A method for enhancing the adhesion between a photoresist material and a substrate, comprising:
forming a first photoresist layer over the substrate wherein a top surface of the substrate comprises a first exposed potion of a metallic layer and a second exposed portion or a material layer around the metallic layer with a non-smooth flat surface; and
forming a second photoresist layer over the first photoresist layer, wherein the second photoresist layer has a higher viscosity than the first photoresist layer.

7. The method of claim 6, wherein the first photoresist layer comprises a dry film.

8. The method of claim 6, wherein the second photoresist layer comprises a dry film.

* * * * *